(12) United States Patent
Dong

(10) Patent No.: US 6,883,013 B1
(45) Date of Patent: Apr. 19, 2005

(54) CONTROL OF LOW FREQUENCY NOISE FLOOR IN UPSAMPLING

(75) Inventor: Chuanyou Dong, San Jose, CA (US)

(73) Assignee: Zoran Corporation, Sunnyvale, CA (US)

( * ) Notice: Subject to any disclaimer, the term of this patent is extended or adjusted under 35 U.S.C. 154(b) by 543 days.

(21) Appl. No.: 09/608,474

(22) Filed: Jun. 30, 2000

(51) Int. Cl.⁷ .............................................. G06F 17/10
(52) U.S. Cl. ....................................................... 708/303
(58) Field of Search ................................. 708/300, 303, 708/306, 313, 551, 319, 250–256, 270; 375/130

(56) References Cited

U.S. PATENT DOCUMENTS

| | | | | |
|---|---|---|---|---|
| 3,867,620 A | * | 2/1975 | Coor ........................... | 708/813 |
| 4,305,133 A | * | 12/1981 | Amada et al. ............... | 708/306 |
| 4,652,832 A | * | 3/1987 | Jasper ......................... | 708/276 |
| 4,727,506 A | * | 2/1988 | Fling .......................... | 708/551 |
| 4,845,498 A | * | 7/1989 | Kubo et al. ................. | 341/131 |
| 4,893,316 A | * | 1/1990 | Janc et al. .................. | 708/300 |
| 4,965,668 A | * | 10/1990 | Abt et al. .................... | 708/551 |
| 5,696,710 A | * | 12/1997 | Hague et al. ............... | 708/551 |
| 5,740,091 A | * | 4/1998 | Fukui et al. ................. | 708/320 |
| 5,808,574 A | * | 9/1998 | Johnson et al. ............. | 708/313 |
| 5,903,482 A | * | 5/1999 | Iwamura et al. ............ | 708/313 |
| 6,173,003 B1 | * | 1/2001 | Whikehart et al. ......... | 375/130 |
| 6,301,596 B1 | * | 10/2001 | Karanovic ................... | 708/319 |
| 6,337,643 B1 | * | 1/2002 | Gabet et al. ................ | 708/250 |

* cited by examiner

*Primary Examiner*—Todd Ingberg
*Assistant Examiner*—Chat C. Do
(74) *Attorney, Agent, or Firm*—Parsons Hsue & de Runtz LLP

(57) ABSTRACT

Method and system for adjusting or controlling a noise floor of a filtered signal for low frequencies. A filtered digital signal, having M bits, is processed to form an one-bit XOR signal. This XOR signal is added to the filtered signal to produce a modified filtered signal. A selected number of LSB bits of the modified filtered signal is removed to form a dithered filtered signal with a noise floor that is reduced for low frequencies.

15 Claims, 3 Drawing Sheets

CONTROL OF LOW FREQUENCY NOISE FLOOR IN UPSAMPLING

FIELD OF THE INVENTION

This invention relates to control of an increased low frequency noise floor that arises due to increased sampling rates or to use of higher order filters.

BACKGROUND OF THE INVENTION

Achievement of a larger signal-to-error ratio, and thus of a larger dynamic range, for an FIR filter in a digital signal processing system such as a digital audio system, is required for an improved (audio) signal. The corresponding increases in the number of filter additions and multiplications, and increased quantization error will produce an increase in the noise "floor" that is present. This noise floor is often increased more for low frequencies than for higher frequencies (above 5 percent of sampling frequency).

K. C. Pohlmann, in Principles of Digital Audio, Howard W. Sams & Co., Indianapolis, Second Edition, 1989, pp. 121–123, discusses the possibility of noise (re)shaping through digital filtering, wherein the spectral shape for a noise curve is changed but the area under the noise curve is unchanged. Pohlmann appears to be more concerned about phase shifts associated with filtering than with other aspects of noise shaping.

What is needed is a supplemental approach that will lower the noise floor at the low frequency end relative to the high frequency end. Preferably, the approach should be capable of being applied independently of the upsampling process and at substantially any place in the overall filtering process. Preferably, the amount by which the low frequency noise floor is reduced should be controllable by a choice of one or more parameters used in the approach.

SUMMARY OF THE INVENTION

These needs are met by the invention, which provides a method of signal processing, applying dithering and similar techniques to logically add a small magnitude random signal to the filtered signal to provide a resulting signal with a relatively lower noise floor for lower frequencies.

A K-bit digital signal is multiplied by L FIR filter coefficient bits, and the resulting M-bit filtered signal ($M \geq K+L$) is received at a first input terminal of an accumulator. A second input terminal of the accumulator receives one or more supplemental bits, formed as an EXclusive OR product of N LSB bits of the filtered signal. The accumulator adds the supplemental bit(s) to the LSB, or to a selected higher index bit, of the filtered signal to produce a modified filtered signal, and the lowest L bits of this signal are truncated to produce a K-bit dithered, filtered signal.

DESCRIPTION OF BEST MODES OF THE INVENTION

Figure 1:
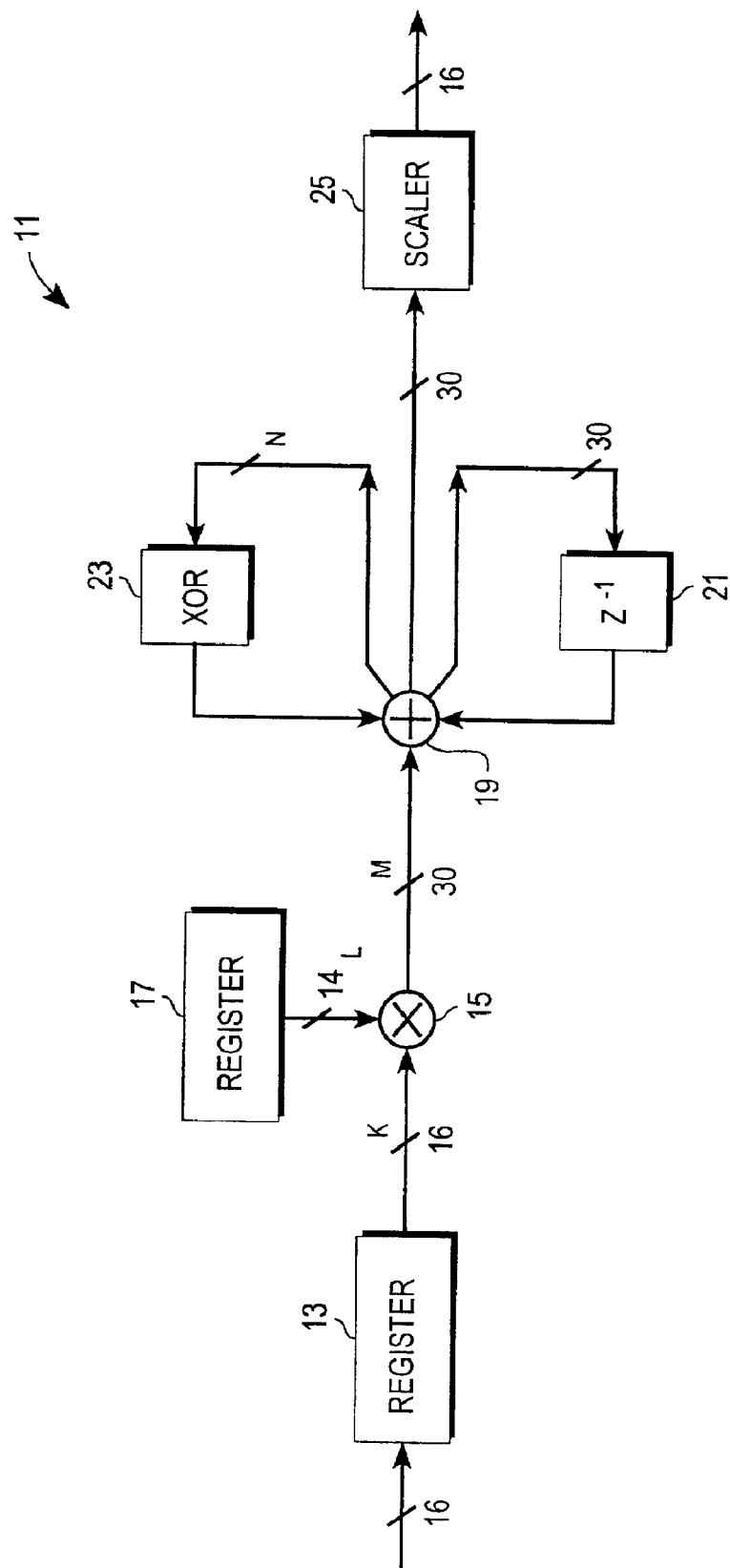
FIG. 1 is a schematic view of apparatus suitable for practicing the invention.

An object of the invention is to add to the filtered signal a random signal that changes the low frequency characteristics of noise associated with the resulting signal, relative to the high frequency characteristics of such noise. FIG. 1 schematically illustrates apparatus 11 that can achieve this object. An incoming digital signal s(n) (n=1, 2, ... ), not yet filtered, is received by a register 13, and the data in the signal are latched. The latched data (e.g., K=16 bits) are received at a multiplication module 15, where the data bits are multiplied by L FIR filter coefficients (e.g., L=14 bits) stored in a filter coefficient ROM 17. The resulting M-bit FIR-filtered signal sf(n) (e.g., with $K+L \leq M=30$ bits) issues from the multiplication module 15 and is received at a first input terminal of an addition module or accumulator 19.

The accumulator 19 receives a present supplemental bit at a second input terminal, adds the supplemental bit and the signal data bit, and issues a sum signal (e.g., M=30 bits), which is received by a one-cycle time delay feedback module 21 that returns the present signal sf(n) to the accumulator with a one-cycle time delay at a third input terminal of the accumulator 19.

The sum signal is also received by a modified XOR module 23 that performs an EXclusive OR operation on the N least significant bits (LSBs) of the sum signal to generate a pseudo-random number (PRN) having a one bit value (LSB number N) that is received at a third input terminal of the accumulator 19. Here, N is a selected positive number. This PRN bit is added to the filtered signal sf(n) received at the accumulator 19, and the modified filtered signal is received at a scaler module 25 that truncates M-K LSBs of this sum and issues a filtered, dithered signal sfd(n) that includes the K MSBS.

This apparatus provides a dithering operation, which is then truncated before the output signal issues. The result is a K-bit output signal sfd(n) with a lowered frequency floor.

Figure 2:
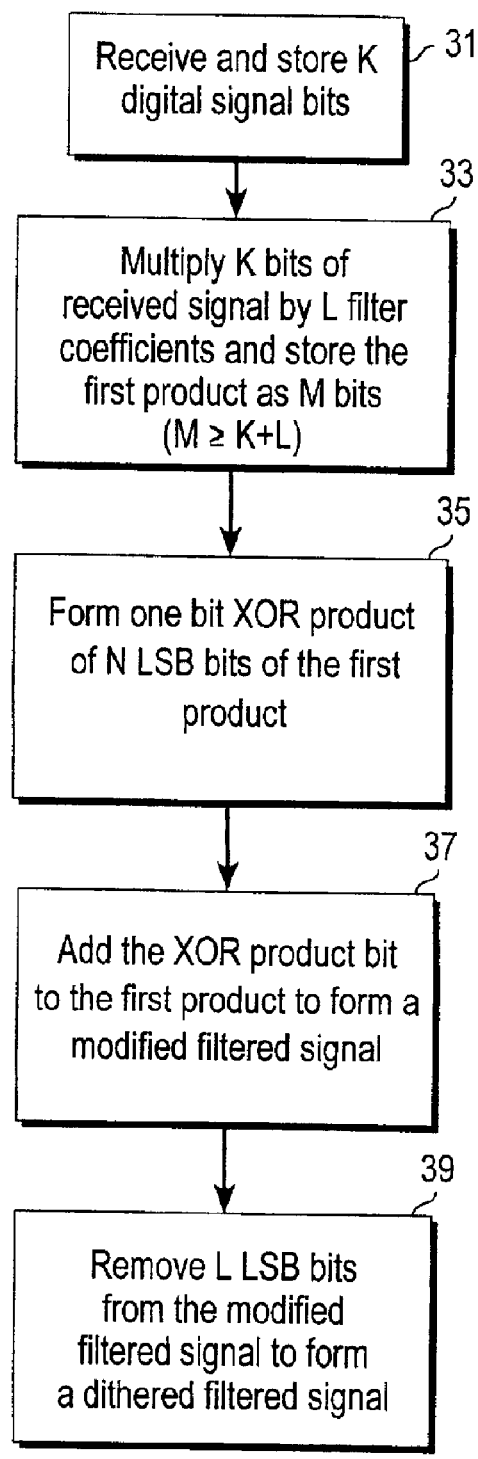
FIG. 2 is a flow chart of a procedure for practicing the invention.

FIG. 2 is a flow chart of a procedure for practicing the invention. A K-bit digital signal is received (and stored) in step 31. In step 33, L filter coefficient bits are multiplied by the K signal bits; the result is a filtered signal having M bits, with $M \geq K+L$. In step 35, a one-bit EXclusive OR (XOR) product is formed from N LSBs of the filtered signal. In step 37, the one-bit XOR product is added to the M-bit filtered signal, at the LSB or at a selected higher index bit, to provide an M-bit modified filtered signal. In step 39, the modified filtered signal is truncated by removing M-K LSB bits. This produces a filtered, dithered signal sfd(n) with a reduced noise floor for low frequencies.

Figure 3:
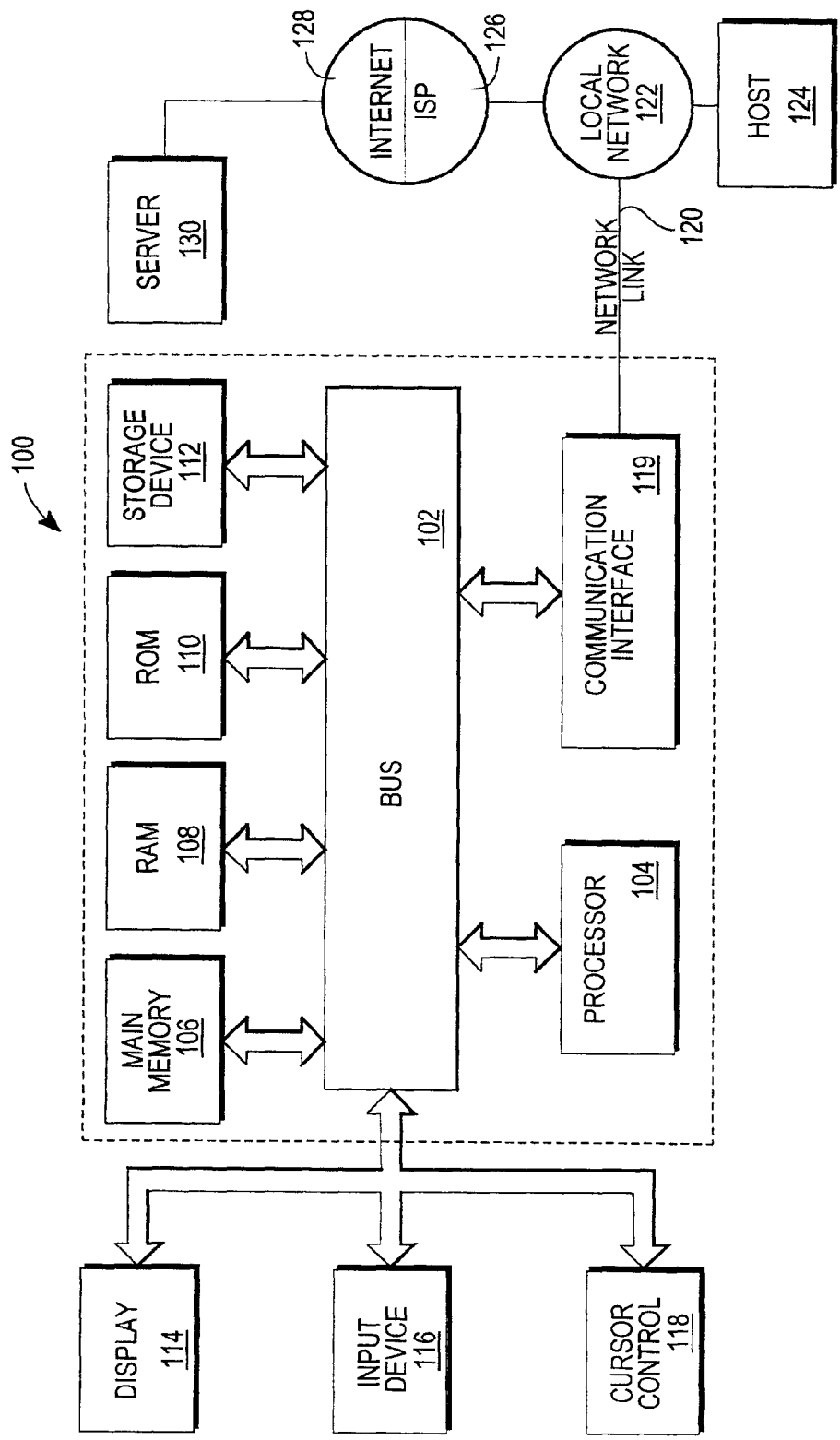
FIG. 3 illustrates a computer system to practice the invention.

FIG. 3 shows a block diagram of a general computer system 100, which may be used to implement various hardware components of the invention, such as a client an applications server and a database management system. The computer system 100 includes a bus 102 or other communication mechanism for communicating information and a processor 104, coupled with the bus 102, for processing information. The computer system 100 also includes a main memory 106, such as a random access memory (RAM) or other dynamic storage device, coupled to the bus 102, for storing information and instructions to be executed by the processor 104. The main memory 106 also may be used for storing temporary variables or other intermediate information during execution of instructions by the processor 104. The computer system 100 further optionally includes a read only memory (ROM) 110 or other static storage device, coupled to the bus 102, for storing static information and instructions for the processor 104. A storage device 112, such as a magnetic disk or optical disk, is provided and is coupled to the bus 102 for storing information and instructions.

The computer system 100 may also be coupled through the bus to a display 114, such as a cathode ray tube (CRT), for displaying information to a computer user. An input device 116, including alphanumeric and other keys, is coupled to the bus for communicating information and commands to the processor 110. Another type of user input device is a cursor control 118, such as a mouse, a trackball or cursor direction keys for communicating direction information and command selections to the processor 104 and for controlling cursor movement on the display 114. This input device typically has one degree of freedom in each of two axes, such as x- and y-axes, that allows the device to specify locations in a plane.

The functionality of the invention is provided by the computer system 100 in response to the processor 104 executing one or more sequences of instructions contained in main memory 106. These instructions may be read into main memory 106 from another computer-readable medium, such as a storage device 112. Execution of the sequences of instructions contained in the main memory 106 causes the processor 104 to perform the process steps described herein. In alternative embodiments, hard-wired circuitry may be used in place of, or in combination with, software instructions to implement the invention. Embodiments of the invention are not limited to any specific combination of hard-wired circuitry and software.

The term "computer-readable medium", as used herein, refers to any medium that participates in providing instructions to the processor 104 for execution. This medium may take many forms, including but not limited to non-volatile media, volatile media and transmission media. Non-volatile media includes, for example, optical and magnetic disks, such as the storage disks 112. Volatile media includes dynamic memory, such as RAM, in the storage device 112. Transmission media includes coaxial cables, copper wire and fiber optics and includes the wires that are part of the bus 102. Transmission media can also take the form of acoustic or electromagnetic waves, such as those generated during radiowave, infrared and optical data communications.

Common forms of computer-readable media include, for example, a floppy disk, a flexible disk, a hard disk, magnetic tape or any other magnetic medium, a CD-ROM, any other optical medium, punchcards, paper tape, any other physical medium with patterns of holes or apertures, a RAM, a ROM, a PROM, an EPROM, a Flash-EPROM, any other memory chip or cartridge, a carrier wave as described hereinafter, or any other medium from which a computer can be read.

Various forms of computer-readable media may be involved in carrying out one or more sequences of one or more instructions to the processor 104 for execution. For example, the instructions may initially be carried on a magnetic disk of a remote computer. The remote computer can load the instructions into its dynamic memory and send the instructions over a telephone, using a modem. A modem local to the computer system 100 can receive data over a telephone line and use infrared transmitter to convert and transmit the data to the an infrared detector connected to the computer system bus. The bus will carry the data to the main memory 106, from which the processor receives and executes the instructions. Optionally, the instructions receive by the main memory 106 can be stored on the storage device 112, either before or after execution by the processor 104.

The computer system 100 also includes a communications interface 119, coupled to the bus 102, which provides two-way data communication coupling to a network link 120 that is connected to a local area network (LAN) or to a wide area network (WAN). For example, the communications interface 119 may be an integrated services digital network (ISDN) card or a modem to provide a data communication connection to a corresponding type of telephone line. As another example, the communications interface 119 may be a local area network card to provide a data communication connection to a compatible LAN. Wireless links may also be implemented. In any such implementation, the communications interface 119 sends and receives electrical, electromagnetic or optical signals that carry digital data streams representing various types of information.

The network link 120 typically provides data communication through one or more networks to other data devices. For example, the data link 120 may provide a connection through an LAN 122 to a host computer 124 or to data equipment operated by an Internet Service Provider (ISP) 126. The ISP, in turn, provides data communication services through the world wide packet data communication network, now commonly known as the "Internet" 128, served by one or more servers 130. The LAN 122 and the Internet 128 both use electrical, electromagnetic and/or optical signals to carry the digital data streams. The signals carried by these network, the signals carried on the network link 120 and the signals carried on the communications interface 119, are examples of carrier waves that transport the information.

What is claimed is:

1. A method for adjusting a noise floor of a filtered signal for low frequencies, the method comprising:
   providing a digital signal, having M bits, that has been digitally filtered, where M is a selected positive number;
   forming an EXclusive OR product of N least significant bits (LSBs) of the M-bit filtered signal, to provide a one-bit supplement signal, where N is a selected positive number satisfying $N+1 \leq M$;
   adding the supplement signal to the M-bit filtered signal to produce a modified filtered signal; and
   removing L LSBs from the modified filtered signal to produce a dithered, filtered signal, where L is a selected positive number satisfying $L+1 \leq M$.

2. The method of claim 1, further comprising choosing said integer M=30.

3. The method of claim 1, further comprising choosing said integer N=16.

4. The method of claim 1, further comprising choosing said integer L in a range $1 \leq L \leq 16$.

5. The method of claim 1, further comprising providing said filtered signal as an FIR-filtered signal.

6. A system for adjusting a noise floor of a filtered signal for low frequencies, the system comprising a computer that is programmed:
   to provide a digital signal, having M bits, that has been digitally filtered, where M is a selected positive number;
   to form an EXclusive OR product of N least significant bits (LSBs) of the M-bit filtered signal, to provide a one-bit supplement signal, where N is a selected positive number satisfying $N+1 \leq M$;
   to add the supplement signal to the M-bit filtered signal to produce a modified filtered signal; and
   to remove L LSBs from the modified filtered signal to produce a dithered, filtered signal, where L is a selected positive number satisfying $L+1 \leq M$.

7. The system of claim 6, wherein said computer is further programmed to choose said integer M=30.

8. The system of claim 6, wherein said computer is further programmed to choose said integer N=16.

9. The system of claim 6, wherein said computer is further programmed to choose said integer L to lie in a range $1 \leq L \leq 16$.

10. The system of claim 6, wherein said computer is further programmed to provide said filtered signal as an FIR-filtered signal.

11. An article of manufacture comprising:
a computer usable medium having computer readable program code means embodied in the medium;
computer readable program code means for causing a computer to provide a digital signal, having M bits, that has been digitally filtered, where M is a selected positive number, computer readable program code means for causing a computer to form an EXclusive OR product of N least significant bits (LSBs) of the M-bit filtered signal, to provide a one-bit supplement signal, where N is a selected positive number satisfying $N+1 \leq M$; computer readable program code means for causing a computer to add the supplement signal to the M-bit filtered signal to produce a modified filtered signal; and computer readable program code means for causing a computer to remove L LSBs from the modified filtered signal to produce a dithered, filtered signal, where L is a selected positive number satisfying $L+1 \leq M$.

12. The article of manufacture of claim 11, wherein at least one of said computer readable program code means chooses said integer M=30.

13. The article of manufacture of claim 11, wherein at least one of said computer readable program code means chooses said integer N=16.

14. The article of manufacture of claim 11, wherein at least one of said computer readable program code means chooses said integer L in a range $1 \leq L \leq 16$.

15. The article of manufacture of claim 11, wherein at least one of said computer readable program code means provides said filtered signal as an FIR-filtered signal.

\* \* \* \* \*